(12) United States Patent
Wang

(10) Patent No.: US 9,236,580 B2
(45) Date of Patent: Jan. 12, 2016

(54) ORGANIC ELECTRONIC DEVICE FOR LIGHTING

(71) Applicant: E I DU PONT DE NEMOURS AND COMPANY, Wilmington, DE (US)

(72) Inventor: Ying Wang, Wilmington, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

(21) Appl. No.: 14/349,354

(22) PCT Filed: Oct. 19, 2012

(86) PCT No.: PCT/US2012/061186
§ 371 (c)(1),
(2) Date: Apr. 3, 2014

(87) PCT Pub. No.: WO2013/059718
PCT Pub. Date: Apr. 25, 2013

(65) Prior Publication Data
US 2014/0239285 A1    Aug. 28, 2014

Related U.S. Application Data

(60) Provisional application No. 61/549,054, filed on Oct. 9, 2011.

(51) Int. Cl.
*H01L 35/24* (2006.01)
*H01L 51/00* (2006.01)
*H01L 51/50* (2006.01)

(52) U.S. Cl.
CPC ............ *H01L 51/504* (2013.01); *H01L 51/508* (2013.01); *H01L 51/5076* (2013.01); *H01L 51/0037* (2013.01); *H01L 51/0053* (2013.01);
(Continued)

(58) Field of Classification Search
CPC ...................... H01L 51/504; H01L 2251/5346
USPC ........................................................... 257/40
See application file for complete search history.

(56) References Cited

U.S. PATENT DOCUMENTS

| | | |
|---|---|---|
| 6,670,645 B2 | 12/2003 | Grushin et al. |
| 6,875,524 B2 | 4/2005 | Hatwar et al. |
| 7,250,461 B2 | 7/2007 | Hsu et al. |

(Continued)

FOREIGN PATENT DOCUMENTS

| | | | | |
|---|---|---|---|---|
| KR | 10-2007-0067775 | * | 6/2007 | ............. C09K 11/06 |
| WO | 03/040257 A1 | | 5/2003 | |

(Continued)

OTHER PUBLICATIONS

International Search Report, Application No. PCT/US2012/061186 Dated Feb. 27, 2013.

(Continued)

*Primary Examiner* — David S Blum

(57) ABSTRACT

There is provided an organic electronic device including an anode, a hole transport layer, an emissive layer, an electron transport layer, and a cathode. The emissive layer includes at least one first electroluminescent material and the electron transport layer includes at least one electron transport material and at least one second electroluminescent material. The second electroluminescent material has a concentration that is greater adjacent the emissive layer. The device has white light emission.

16 Claims, 6 Drawing Sheets

(52) U.S. Cl.
CPC ......... *H01L 51/0072* (2013.01); *H01L 51/0085* (2013.01); *H01L 2251/5346* (2013.01)

(56) References Cited

U.S. PATENT DOCUMENTS

| | | | |
|---|---|---|---|
| 7,749,407 | B2 | 7/2010 | Hsu et al. |
| 2004/0102577 | A1 | 5/2004 | Hsu et al. |
| 2004/0127637 | A1 | 7/2004 | Hsu et al. |
| 2005/0158577 | A1 | 7/2005 | Ishibashi et al. |
| 2005/0205860 | A1 | 9/2005 | Hsu et al. |
| 2007/0063638 | A1 | 3/2007 | Tokairin et al. |
| 2007/0166567 | A1 | 7/2007 | Hung et al. |
| 2007/0292713 | A9 | 12/2007 | Dobbs et al. |
| 2009/0179561 | A1 | 7/2009 | Fukuoka et al. |
| 2010/0148663 | A1 | 6/2010 | Tsai et al. |
| 2010/0187552 | A1* | 7/2010 | Lee et al. ........................ 257/98 |
| 2011/0101312 | A1 | 5/2011 | Lecloux et al. |

FOREIGN PATENT DOCUMENTS

| | | |
|---|---|---|
| WO | 03/063555 A1 | 7/2003 |
| WO | 03/091688 A2 | 11/2003 |
| WO | 2004/016710 A1 | 2/2004 |
| WO | 03/008424 A1 | 6/2005 |
| WO | 2007/021117 A1 | 2/2007 |
| WO | 2007/145979 A2 | 12/2007 |
| WO | 2009/018009 A1 | 2/2009 |
| WO | 2009/067419 A1 | 5/2009 |

OTHER PUBLICATIONS

CRC Handbook of Chemistry and Physics, 81$^{st}$ Edition, (2000-2001) (Not Included).

Y. Wang, Kirk-Othmer Encyclopedia of Chemical Technology, 4$^{th}$ edition, vol. 18, p. 837-860, 1996.

* cited by examiner

ORGANIZE ELECTRONIC DEVICE FOR LIGHTING

RELATED APPLICATION DATA

This application claims priority under 35 U.S.C. §119(e) from U.S. Provisional Application No. 61/549,045, filed on Oct. 19, 2011, which is incorporated by reference herein in its entirety.

BACKGROUND INFORMATION

1. Field of the Disclosure

This disclosure relates in general to organic electronic devices and particularly to devices used for lighting.

2. Description of the Related Art

In organic electronic devices, such as organic light emitting diodes ("OLED"), that make up OLED displays or OLED lighting devices, the organic active layer is sandwiched between two electrical contact layers. In an OLED, at least one of the electrical contact layers is light-transmitting, and the organic active layer emits light through the light-transmitting electrical contact layer upon application of a voltage across the electrical contact layers.

It is well known to use organic electroluminescent compounds as the active component in light-emitting diodes. Simple organic molecules, conjugated polymers, and organometallic complexes have been used. Devices frequently include one or more charge transport layers, which are positioned between a photoactive (e.g., light-emitting) layer and an electrical contact layer. A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode. Charge transport materials can also be used as hosts in combination with the photoactive materials.

There is a continuing need for devices with improved properties.

SUMMARY

There is provided an organic electronic device comprising in order: an anode, a hole transport layer, an emissive layer, an electron transport layer, and a cathode, wherein the emissive layer comprises at least one first electroluminescent material, the electron transport layer is a vapor-deposited layer comprising at least one electron transport material and at least one second electroluminescent material such that the second electroluminescent material has a concentration that is greater adjacent the emissive layer, and wherein the device has white light emission.

In some embodiments, the emissive layer further comprises a third electroluminescent material.

In some embodiments, one or more of the electroluminescent materials is an iridium complex having organic ligands.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
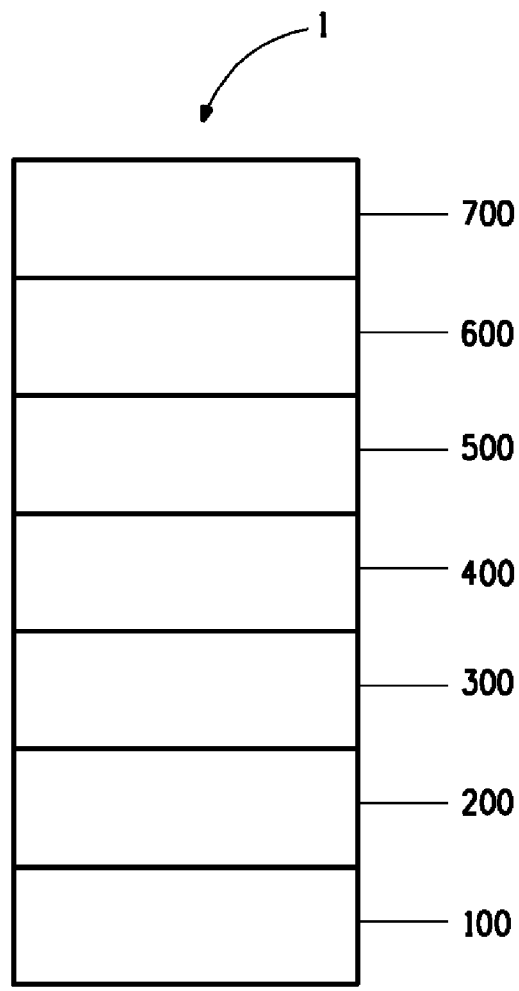
FIG. 1 includes an illustration of one example of a prior art organic electronic device.

Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms, followed by the Electronic Device and Examples.

1. DEFINITIONS AND CLARIFICATION OF TERMS

Before addressing details of embodiments described below, some terms are defined or clarified.

The term "blue" is intended to mean radiation that has an emission maximum at a wavelength in a range of approximately 380-495 nm.

The term "charge transport," when referring to a layer, material, member, or structure is intended to mean such layer, material, member, or structure facilitates migration of such charge through the thickness of such layer, material, member, or structure with relative efficiency and small loss of charge. Hole transport materials facilitate positive charge migration; electron transport materials facilitate negative charge migration.

The term "CRI" refers to the color rendering index devised by the Commission Internationale de L'Eclairage (International Commission on Illumination, or CIE). It is a measure of the quality of color light. It generally ranges from zero for a source like a low-pressure sodium vapor lamp, which is monochromatic, to one hundred, for a source like an incandescent light bulb, which emits essentially blackbody radiation.

The term "dopant" is intended to mean a material, within a layer including a host material, that changes the electronic characteristic(s) or the targeted wavelength(s) of radiation emission, reception, or filtering of the layer compared to the electronic characteristic(s) or the wavelength(s) of radiation emission, reception, or filtering of the layer in the absence of such material. A dopant of a given color refers to a dopant which emits light of that color.

The term "electroluminescent material" refers to a material that emits light in response to the passage of an electric current or to a strong electric field.

The term "emissive" refers to a layer which is light-emitting.

The term "green" is intended to mean radiation that has an emission maximum at a wavelength in a range of approximately 495-570 nm.

The term "hole injection" when referring to a layer, material, member, or structure, is intended to mean such layer, material, member, or structure facilitates injection and migration of positive charges through the thickness of such layer, material, member, or structure with relative efficiency and small loss of charge.

The term "host material" is intended to mean a material, usually in the form of a layer, to which a dopant may or may not be added. The host material may or may not have electronic characteristic(s) or the ability to emit, receive, or filter radiation. When a dopant is present in a host material, the host material does not significantly change the emission wavelength of the dopant material.

The term "photoluminescence quantum yield" is intended to mean the ratio of photons absorbed to photons emitted through luminescence.

The term "red" is intended to mean radiation that has an emission maximum at a wavelength in a range of approximately 590-780 nm.

The term "small molecule," when referring to a compound, is intended to mean a compound which does not have repeating monomeric units. In one embodiment, a small molecule has a molecular weight no greater than approximately 2000 g/mol.

The term "substrate" is intended to mean a base material that can be either rigid or flexible and may be include one or more layers of one or more materials, which can include, but are not limited to, glass, polymer, metal or ceramic materials or combinations thereof. The substrate may or may not include electronic components, circuits, or conductive members.

The term "white light" refers to the effect of combining the visible colors of light in suitable proportions so that the light appears white or colorless to the human eye. Since the impression of white is obtained by three summations of light intensity across the visible spectrum, the number of combinations of light wavelengths that produce the sensation of white is practically infinite. The impression of white light can also be created by mixing appropriate intensities of the primary colors of light, red, green and blue (RGB), a process called additive mixing, as seen in many display technologies.

The term "yellow" is intended to mean radiation that has an emission maximum at a wavelength in a range of approximately 570-590 nm.

In this specification, unless explicitly stated otherwise or indicated to the contrary by the context of usage, where an embodiment of the subject matter hereof is stated or described as comprising, including, containing, having, being composed of or being constituted by or of certain features or elements, one or more features or elements in addition to those explicitly stated or described may be present in the embodiment. An alternative embodiment of the disclosed subject matter hereof, is described as consisting essentially of certain features or elements, in which embodiment features or elements that would materially alter the principle of operation or the distinguishing characteristics of the embodiment are not present therein. A further alternative embodiment of the described subject matter hereof is described as consisting of certain features or elements, in which embodiment, or in insubstantial variations thereof, only the features or elements specifically stated or described are present.

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. ELECTRONIC DEVICE

An example of a prior art white OLED device is shown schematically in FIG. 1. The device (1) consists of an anode (100), a hole injection layer (200), a hole transport layer (300), a light emitting layer (400), an electron transport layer (500), an electron injection layer (600), and a cathode (700). A support, not shown can be present adjacent either the anode or the cathode. In the light emitting layer, there are two emitters, such as blue and yellow, such that the combined emission results in a white color.

However, in some cases, three or four emitters are used. In the discussion which follows, three emitters will be used for illustrative purposes. However, more than three could be used.

Figure 2:
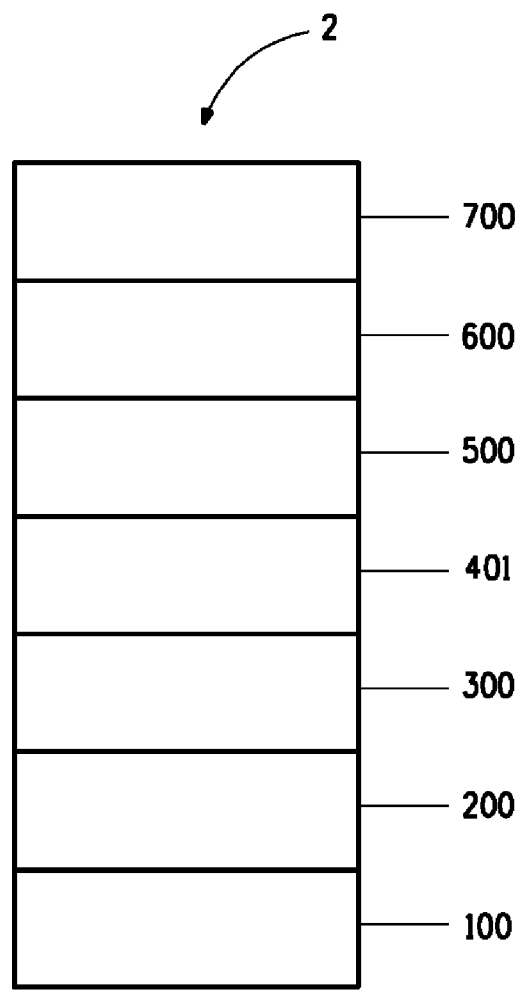
FIG. 2 includes another illustration of a prior art organic electronic device.

In FIG. 2, a prior art device (2) is shown in which three emitters, having red, green and blue emission, are present in a single emissive layer (layer 401). With one single light emitting layer, the fabrication process is cheaper. However, it is very difficult to find one host system that can work with all three blue, green, and red emitters at their maximal efficiency. This single emissive layer approach therefore has the drawback of reduced device performance.

Figure 3:
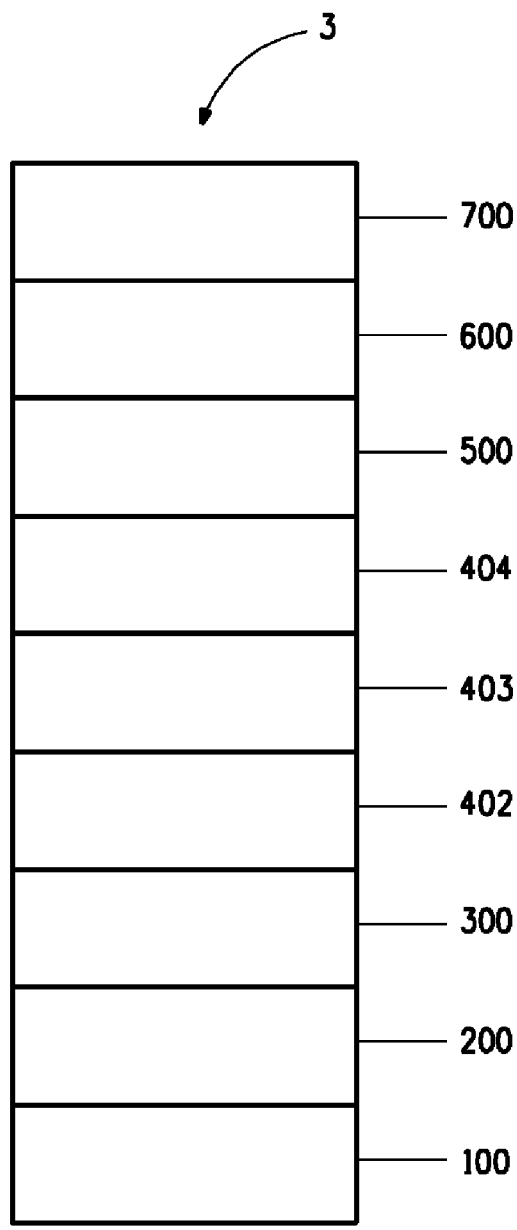
FIG. 3 includes another illustration of a prior art organic electronic device.

In FIG. 3, a prior art device is shown in which there is a separate layer for each emitter, layers 402, 403, and 404. With three separate emitting layers, each color can be individually optimized with its own host to achieve maximal efficiency. However, the fabrication process is more complicated with three separate layers.

Figure 4:
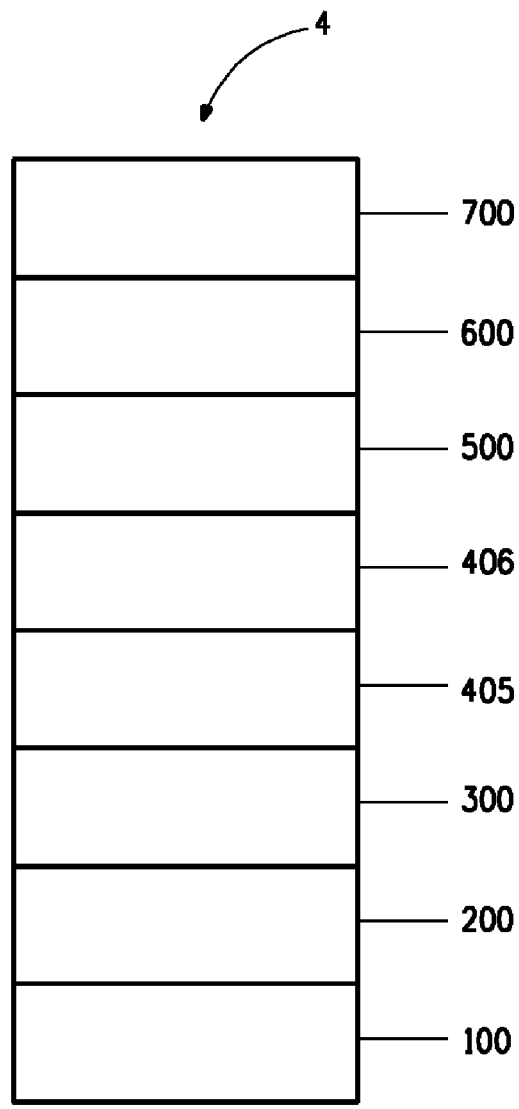
FIG. 4 includes another illustration of a prior art organic electronic device.

A compromise may be made by using two emitting layers, in which one of the layers having green and red emitters and the other layer having a blue emitter. This is shown in FIG. 4, where layer 405 has red and green emitters, and layer 406 has a blue emitter. It is much easier to find a common host for green and red emitters and maintain their efficiency, while the blue layer can be optimized separately. The fabrication process is easier for this architecture with dual emissive layers due to the elimination of one layer, but it still has one extra layer than the single emissive layer approach.

Figure 5:
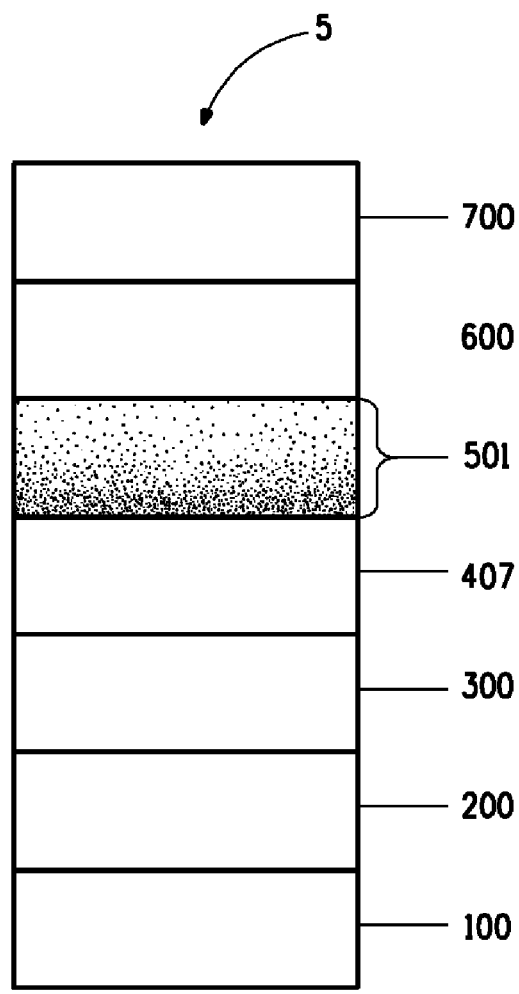
FIG. 5 includes an illustration of an organic electronic device according to one embodiment of the present invention.

One embodiment of the present invention is shown in FIG. 5. In this embodiment, the second emitter layer is eliminated and its function is combined with the electron transport layer (501). In this embodiment, blue emitter molecules are doped into the electron transport layer 501. In this embodiment, the concentration of blue dopant is greatest adjacent the emissive layer and decreases through the layer so that the concentration is least in the part of the layer that is adjacent the electron injection layer.

Figure 6:
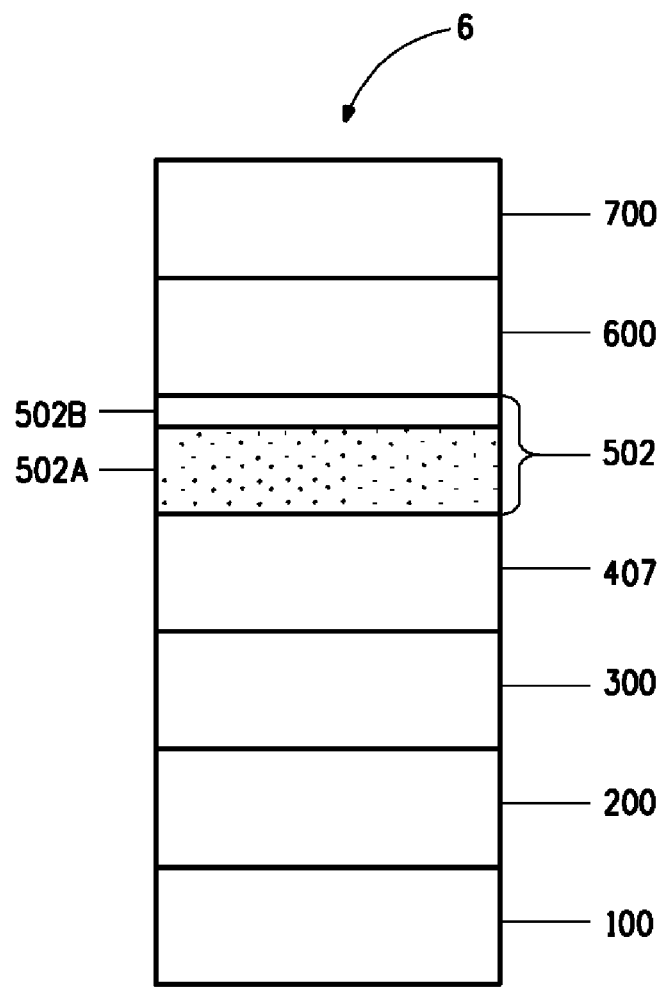
FIG. 6 includes another illustration of an organic electronic device according to one embodiment of the present invention.

Another embodiment of the present invention is shown in FIG. 6. In this embodiment also, the second emitter layer is eliminated and its function is combined with the electron transport layer (502). In this embodiment, blue emitter molecules are doped throughout the electron transport layer 502, except in a very thin region adjacent the electron injection layer. Thus, blue dopant is present in area 502A of the electron transport layer, but not in area 502B.

The devices disclosed in this invention have the same number of layers as the single emissive layer devices (FIG. 2), but the architecture allows the separate optimization of blue efficiency to achieve maximal device performance.

a. Emissive Layer

The emissive layer comprises at least one electroluminescent ("EL") material. Any EL material can be used in the devices, including, but not limited to, small molecule organic fluorescent compounds, luminescent metal complexes, conjugated polymers, and mixtures thereof. Examples of fluorescent compounds include, but are not limited to, chrysenes, pyrenes, perylenes, rubrenes, coumarins, anthracenes, thiadiazoles, derivatives thereof, arylamino derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of iridium with phenylpyridine, phenylquinoline, or phenylpyrimidine ligands as disclosed in Petrov et al., U.S. Pat. No. 6,670,645 and Published PCT Applications WO 03/063555 and WO 2004/016710, and organometallic complexes described in, for example, Published PCT Applications WO 03/008424, WO 03/091688, and WO 03/040257, and mixtures thereof. Examples of conjugated polymers include, but are not limited to poly(phenylenevinylenes), polyfluorenes, poly(spirobifluorenes), polythiophenes, poly(p-phenylenes), copolymers thereof, and mixtures thereof.

Examples of red light-emitting materials include, but are not limited to, complexes of Ir having phenylquinoline or phenylisoquinoline ligands, periflanthenes, fluoranthenes, and perylenes. Red light-emitting materials have been disclosed in, for example, U.S. Pat. No. 6,875,524, and published US application 2005-0158577.

Examples of green light-emitting materials include, but are not limited to, complexes of Ir having phenylpyridine ligands, bis(diarylamino)anthracenes, and polyphenylenevinylene polymers. Green light-emitting materials have been disclosed in, for example, published PCT application WO 2007/021117.

Examples of blue light-emitting materials include, but are not limited to, complexes of Ir having phenylpyridine or phenylimidazole ligands, diarylanthracenes, diaminochrysenes, diaminopyrenes, and polyfluorene polymers. Blue light-emitting materials have been disclosed in, for example, U.S. Pat. No. 6,875,524, and published US applications 2007-0292713 and 2007-0063638.

In some embodiments, for lighting applications it is desirable to use electroluminescent materials which have emission from a triplet excited state or mixed singlet-triplet excited state. In some embodiments, the electroluminescent material is an organometallic complex. In some embodiments, the organometallic complex is cyclometallated. By "cyclometallated" it is meant that the complex contains at least one ligand which bonds to the metal in at least two points, forming at least one 5- or 6-membered ring with at least one carbon-metal bond. In some embodiments, the metal is iridium or platinum. In some embodiments, the organometallic complex is electrically neutral and is a tris-cyclometallated complex of iridium having the formula $IrL_3$ or a bis-cyclometallated complex of iridium having the formula $IrL_2Y$. In some embodiments, L is a monoanionic bidentate cyclometalating ligand coordinated through a carbon atom and a nitrogen atom. In some embodiments, L is an aryl N-heterocycle, where the aryl is phenyl or napthyl, and the N-heterocycle is pyridine, quinoline, isoquinoline, diazine, pyrrole, pyrazole or imidazole. In some embodiments, Y is a monoanionic bidentate ligand. In some embodiments, L is a phenylpyridine, a phenylquinoline, or a phenylisoquinoline. In some embodiments, Y is a β-dienolate, a diketimine, a picolinate, or an N-alkoxypyrazole. The ligands may be unsubstituted or substituted with F, D, alkyl, perfluororalkyl, alkoxyl, alkylamino, arylamino, CN, silyl, fluoroalkoxyl or aryl groups.

In some embodiments, the light-emitting material is a cyclometalated complex of iridium or platinum. Such materials have been disclosed in, for example, U.S. Pat. No. 6,670,645 and Published PCT Applications WO 03/063555, WO 2004/016710, and WO 03/040257.

Examples of organometallic iridium complexes having red emission color include, but are not limited to compounds R1 through R11 below.

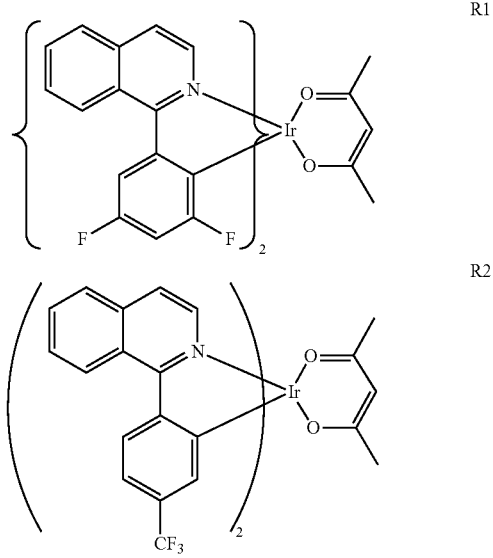

R3
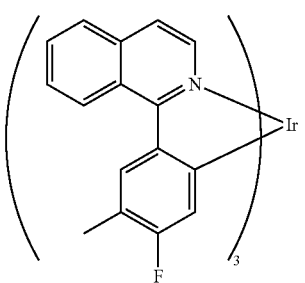
R4
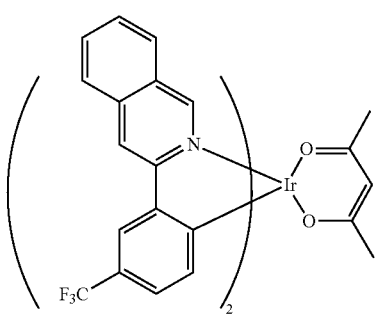
R5
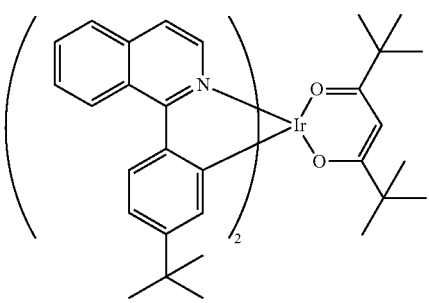
R6
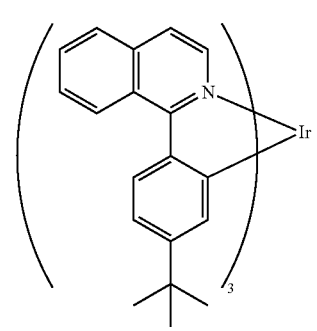
R7
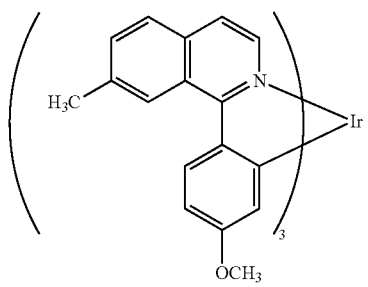
R8
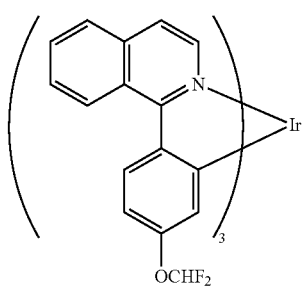
R9
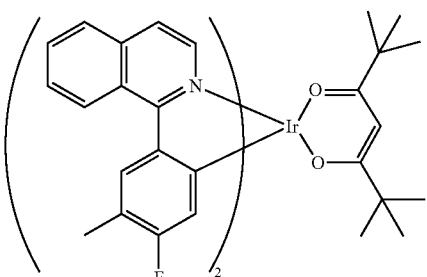
R10
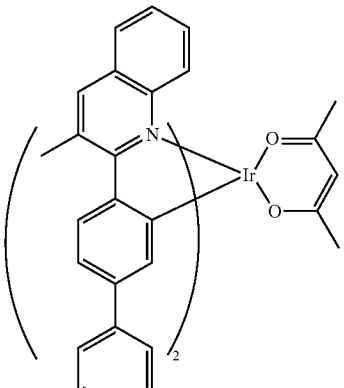
R11
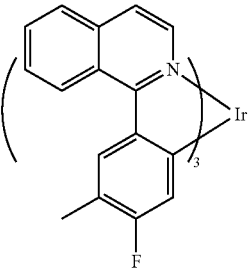
Examples of organometallic iridium complexes having green emission color include, but are not limited to compounds G1 through G11 below.
G1
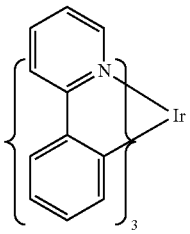

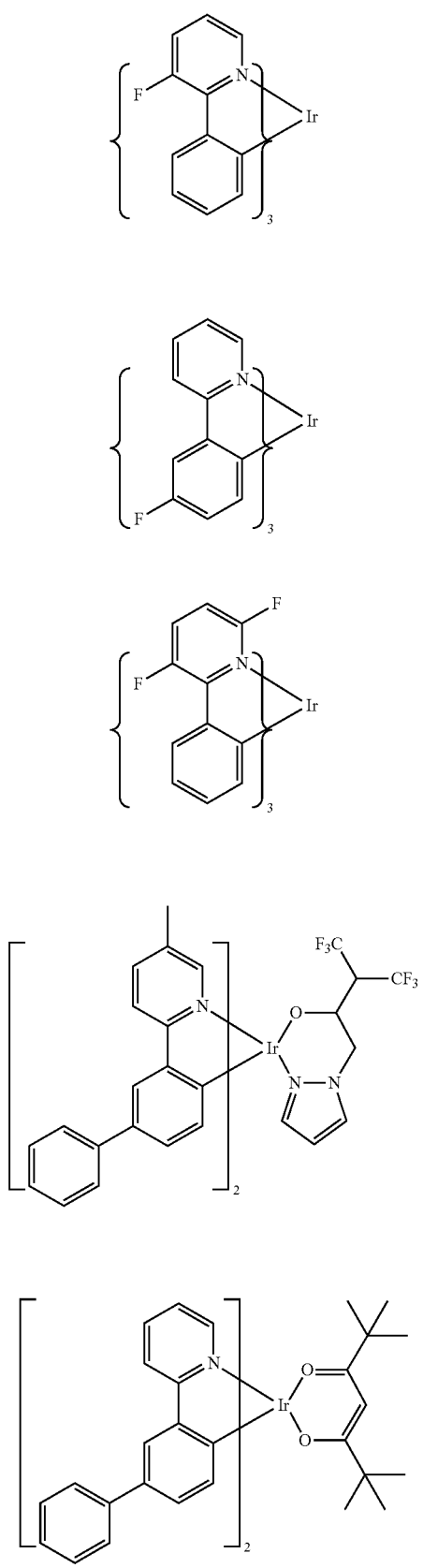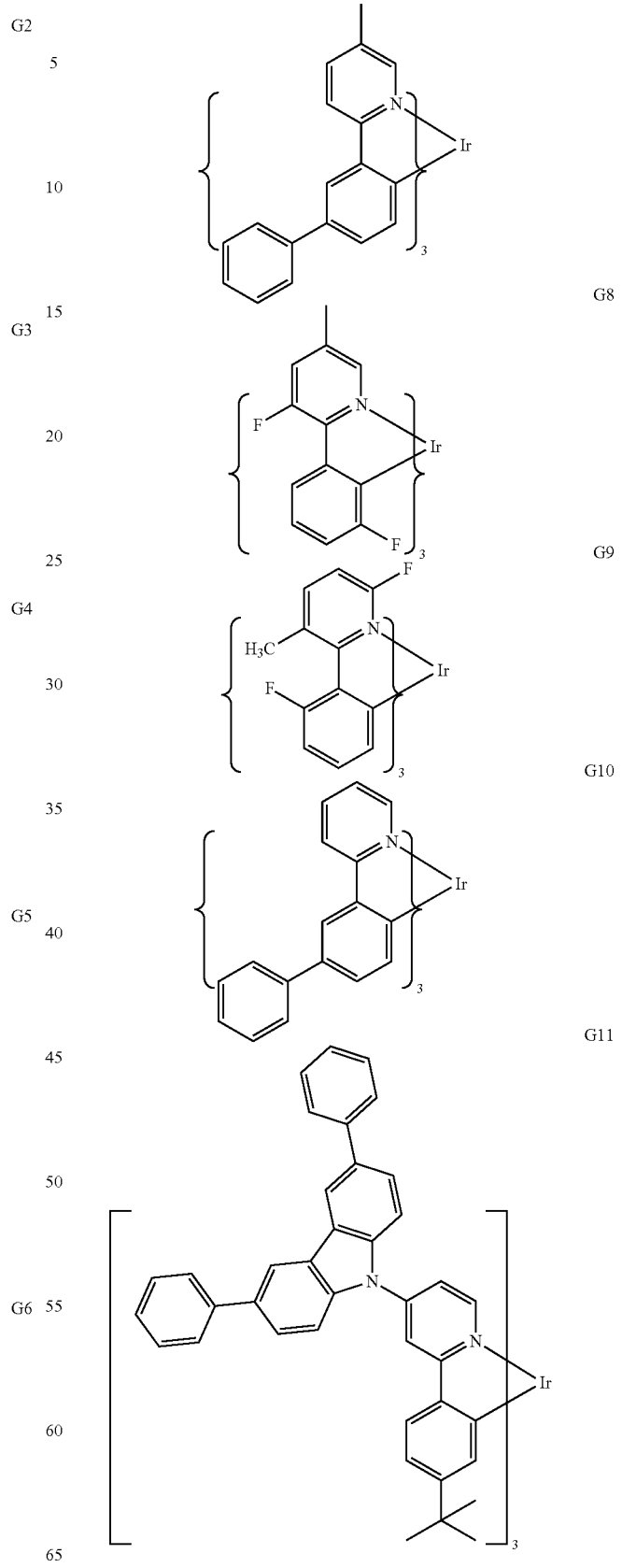

Examples of organometallic iridium complexes having blue emission color include, but are not limited to compounds B1 through B11 below.
B1
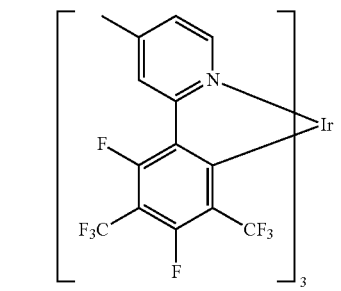
B2
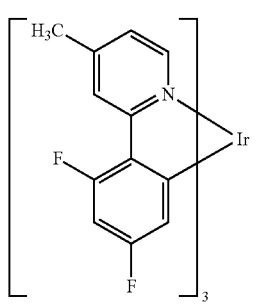
B3
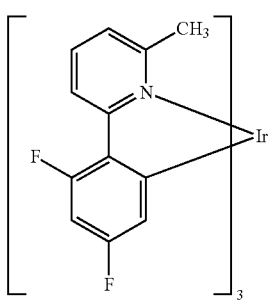
B4
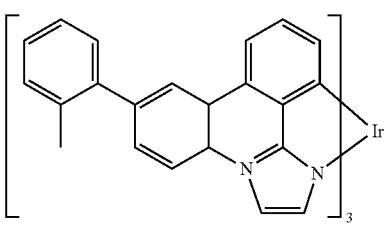
B5
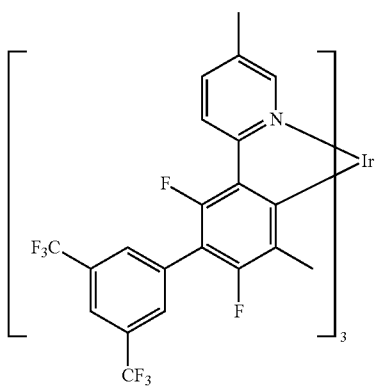
B6
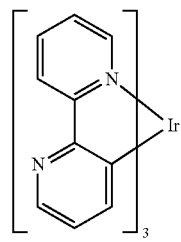
B7
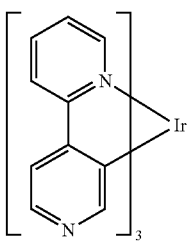
B8
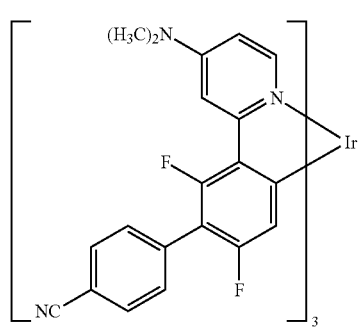
B9
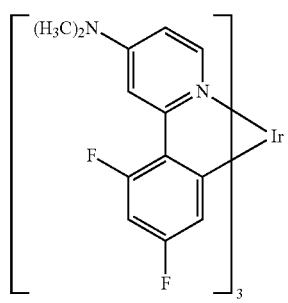
B10
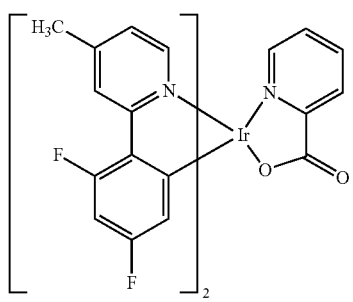

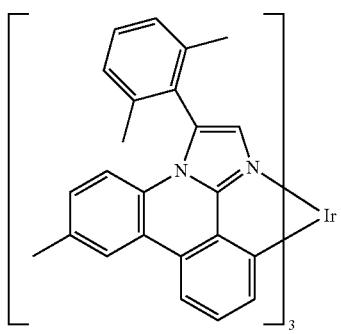

In some embodiments, the emissive layer further comprises a host material to improve processing and/or electronic properties. Examples of host materials include, but are not limited to, carbazoles, indolocarbazoles, chrysenes, phenanthrenes, triphenylenes, phenanthrolines, triazines, naphthalenes, anthracenes, quinolines, isoquinolines, quinoxalines, phenylpyridines, benzodifurans, metal quinolinate complexes, deuterated analogs thereof, and combinations thereof.

In some embodiments, the emissive layer further comprises a third EL material.

In some embodiments, the emissive layer comprises a host, a first EL material which is a red dopant, and a third EL material which is a green dopant. In some embodiments, at least one dopant is an iridium complex having organic ligands. In some embodiments, the iridium complex is a cyclometallated iridium complex. In some embodiments, both the red dopant and the green dopant are cyclometallated complexes of iridium. In some embodiments, the host is selected from the group consisting of indolocarbazoles, triazines, chrysenes, deuterated analogs thereof, and combinations thereof.

In some embodiments, the emissive layer consists essentially of a host and a first EL material. In some embodiments, the emissive layer consists essentially of a host, a red EL material, and a green EL material.

In some embodiments, the total amount of EL dopant in the emissive layer is 1-30% by weight, based on the total weight of the layer; in some embodiments, 5-20% by weight. In some embodiments, a red dopant is present in an amount of 0.1-5% by weight, based on the total weight of the layer; in some embodiments, 0.2-2% by weight. In some embodiments, a green dopant is present in an amount of 5-25% by weight, based on the total weight of the layer; in some embodiments, 10-20% by weight.

b. Electron Transport Layer

The electron transport layer comprises at least one electron transport material and at least one EL material, where the concentration of the EL material decreases from the emissive layer side to the electron injection side. In some embodiments, the electron transport layer consists essentially of an electron transport material and a second EL material.

Examples of electron transport materials which can be used in the electron transport layer include: metal chelated oxinoid compounds, including metal quinolate derivatives such as tris(8-hydroxyquinolato)aluminum (AlQ), bis(2-methyl-8-quinolinolato)(p-phenylphenolato)aluminum (BAlq), tetrakis-(8-hydroxyquinolato)hafnium (HfQ) and tetrakis-(8-hydroxyquinolato)zirconium (ZrQ); and azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthrolines such as 4,7-diphenyl-1,10-phenanthroline (DPA) and 2,9-dimethyl-4,7-diphenyl-1,10-phenanthroline (DDPA); triazines; fullerenes; deuterated analogs thereof; and combinations thereof. In some embodiments, the electron transport material is selected from the group consisting of phenanthroline derivatives, carbazole-containing compounds, deuterated analogs thereof, and combinations thereof.

In some embodiments, the second EL material is a blue dopant. Examples of blue dopants are discussed above. In some embodiments, the blue dopant is a cyclometallated complex of iridium.

The electron transport layer is formed by simultaneous vapor deposition of all the materials in the layer. Any vapor deposition technique can be used so long as the materials are deposited without significant diminution of their physical properties. Such techniques are well known and include chemical vapor deposition and physical vapor deposition techniques. In some embodiments, the electron transport layer is formed by evaporative deposition. The concentration change of the EL dopant in the layer can be controlled by changing the rate of deposition of the dopant. In some embodiments, a thin region of undoped electron transport material is formed at the electron injection layer side. By "undoped" it is meant that the region contains only the electron transport material and no EL dopant. The formation of an undoped region can be accomplished by simply turning off the input from the EL dopant at the end of the deposition process. This results in no added steps to the process. In some embodiments, the undoped area has a thickness in the range of 2-20 nm; in some embodiments 5-15 nm; in some embodiments, 7-12 nm.

In some embodiments, the total amount of EL dopant in the electron transport layer is 1-49% by weight, based on the total weight of the layer; in some embodiments, 2-25% by weight; in some embodiments, 5-15% by weight.

In some embodiments, the photoluminescence quantum yield ("PLQY") of the electron transport layer is greater than 20%; in some embodiments, greater than 50%; in some embodiments, greater than 70%. The PLQY can be measured using equipment designed to determine the value of thin films such as an integrating sphere. However, frequently the PLQY is more conveniently measured in solution. The solution PLQY can be determined using a luminance spectrophotometer. In some embodiments, the PLQY is determined for a solution of the second electroluminescent material in an organic solvent, which usually is a good estimate of the PLQY in films. In some embodiments, this solution PLQY is greater than 20%; in some embodiments, greater than 50%; in some embodiments, greater than 70%.

c. Other Device Layers

The other layers in the device can be made of any materials that are known to be useful in such layers.

A substrate, not shown in the figures, may be present adjacent the anode or the cathode. In some embodiments, the substrate is adjacent the anode. The substrate is a base material that can be either rigid or flexible. The substrate may include one or more layers of one or more materials, which can include, but are not limited to, glass, polymer, metal or ceramic materials or combinations thereof. The substrate may or may not include electronic components, circuits, or conductive members.

The anode is an electrode that is particularly efficient for injecting positive charge carriers. It can be made of, for example materials containing a metal, mixed metal, alloy, metal oxide or mixed-metal oxide, or it can be a conducting polymer, and mixtures thereof. Suitable metals include the Group 11 metals, the metals in Groups 4, 5, and 6, and the Group 8 10 transition metals. If the anode is to be light-transmitting, mixed-metal oxides of Groups 12, 13 and 14 metals are generally used. Examples of suitable materials include, but are not limited to, indium-tin-oxide ("ITO"). indium-zinc-oxide ("IZO"), aluminum-tin-oxide ("ATO"), aluminum-zinc-oxide ("AZO"), and zirconium-tin-oxide ("ZTO"). In some embodiments, the anode comprises a fluorinated acid polymer and conductive nanoparticles. Such materials have been described in, for example, U.S. Pat. No. 7,749,407.

The hole injection layer comprises hole injection material. In some embodiments, hole injection material is electrically conductive or semiconductive material.

The hole injection material can be a polymeric material, such as polyaniline (PANI) or polyethylenedioxythiophene (PEDOT), which are often doped with protonic acids. The protonic acids can be, for example, poly(styrenesulfonic acid), poly(2-acrylamido-2-methyl-1-propanesulfonic acid), and the like. The hole injection material can comprise charge transfer compounds, and the like, such as copper phthalocyanine and the tetrathiafulvalene-tetracyanoquinodimethane system (TTF-TCNQ). In some embodiments, the hole injection layer is made from a dispersion of a conducting polymer and a colloid-forming polymeric acid. Such materials have been described in, for example, U.S. Pat. No. 7,250,461, published U.S. patent applications 2004-0102577, 2004-0127637, and 2005-0205860 and published PCT application WO 2009/018009.

In some embodiments, the hole injection layer comprises a fluorinated acid polymer and conductive nanoparticles. Such materials have been described in, for example, U.S. Pat. No. 7,749,407.

Examples of hole transport materials for the hole transport layer have been summarized for example, in Kirk-Othmer Encyclopedia of Chemical Technology, Fourth Edition, Vol. 18, p. 837-860, 1996, by Y. Wang. Both hole transporting molecules and polymers can be used. Commonly used hole transporting molecules are: N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino)benzaldehyde diphenylhydrazone (DEH), triphenylamine (TPA), bis[4-(N,N-diethylamino) 2-methylphenyl](4-methylphenyl)methane (MPMP), 1-phenyl-3-[p-(diethylamino)styryl]-5-[p-(diethylamino)phenyl]pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), N,N'-bis(naphthalen-1-yl)-N,N'-bis-(phenyl)benzidine (NPB), and porphyrinic compounds, such as copper phthalocyanine. Commonly used hole transporting polymers are polyvinylcarbazole, (phenylmethyl)-polysilane, and polyaniline. It is also possible to obtain hole transporting polymers by doping hole transporting molecules such as those mentioned above into polymers such as polystyrene and polycarbonate. In some cases, triarylamine polymers are used, especially triarylamine-fluorene copolymers. In some cases, the polymers and copolymers are crosslinkable. In some embodiments, the hole transport layer further comprises a p-dopant. In some embodiments, the hole transport layer is doped with a p-dopant Examples of p-dopants include, but are not limited to, tetrafluorotetracyanoquinodimethane (F4-TCNQ) and perylene-3,4,9,10-tetracarboxylic-3,4,9,10-dianhydride (PTCDA).

Depending upon the application of the device, the photoactive layer 400 can be a light-emitting layer that is activated by an applied voltage (such as in a light-emitting diode or light-emitting electrochemical cell), a layer of material that responds to radiant energy and generates a signal with or without an applied bias voltage (such as in a photodetector). In one embodiment, the electroactive layer comprises an organic electroluminescent ("EL") material.

The electron injection layer can comprise a material selected from the group consisting of Li-containing organometallic compounds, LiF, $Li_2O$, Cs-containing organometallic compounds, CsF, $Cs_2O$, and $Cs_2CO_3$. In some embodiments, the material deposited for the electron injection layer reacts with the underlying electron transport layer and/or the cathode and does not remain as a measurable layer.

The cathode is an electrode that is particularly efficient for injecting electrons or negative charge carriers. The cathode can be any metal or nonmetal having a lower work function than the anode. Materials for the cathode can be selected from alkali metals of Group 1 (e.g., Li, Cs), the Group 2 (alkaline earth) metals, the Group 12 metals, including the rare earth elements and lanthanides, and the actinides. Materials such as aluminum, indium, calcium, barium, samarium and magnesium, as well as combinations, can be used.

It is known to have other layers in organic electronic devices. The choice of materials for each of the component layers is preferably determined by balancing the positive and negative charges in the emitter layer to provide a device with high electroluminescence efficiency. It is understood that each functional layer can be made up of more than one layer.

However, for most lighting applications it is desirable to use the minimum number of layers, to reduce cost. In some embodiments, the device consists essentially of, in order, an anode, a hole injection layer, a hole transport layer, an emissive layer, an electron transport layer, an electron injection layer, and a cathode, where the emissive layer and the electron transport layer are as described above.

In one embodiment, the different layers have the following range of thicknesses: anode, 500-5000 Å, in one embodiment 1000-2000 Å; hole injection layer, 50-3000 Å, in one embodiment 200-1000 Å; hole transport layer, 50-2000 Å, in one embodiment 200-1000 Å; emissive layer, 10-2000 Å, in one embodiment 100-1000 Å; electron transport layer, 100-2000 Å, in one embodiment 200-1500 Å; electron injection layer, 1-25 Å, in one embodiment 5-15 Å; cathode, 200-10000 Å, in one embodiment 300-5000 Å. The desired ratio of layer thicknesses will depend on the exact nature of the materials used.

The electron transport layer is formed by vapor deposition. The other device layers can be formed by any deposition technique, or combinations of techniques, including vapor deposition, liquid deposition, and thermal transfer. Conventional vapor deposition techniques can be used, as discussed above. The organic layers can be applied from solutions or dispersions in suitable solvents, using conventional coating or printing techniques, including but not limited to spin-coating, dip-coating, roll-to-roll techniques, ink-jet printing, continuous nozzle printing, screen-printing, gravure printing and the like.

For liquid deposition methods, a suitable solvent for a particular compound or related class of compounds can be readily determined by one skilled in the art. For some applications, it is desirable that the compounds be dissolved in non-aqueous solvents. Such non-aqueous solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the liquid composition, either as a solution or dispersion as described herein, comprising the new compounds, includes, but not limited to, chlorinated hydrocarbons (such as methylene chloride, chloroform, chlorobenzene), aromatic hydrocarbons (such as substituted and non-substituted toluenes and xylenes), including trifluorotoluene), polar solvents (such as tetrahydrofuran (THP), N-methylpyrrolidone) esters (such as ethylacetate) alcohols (isopropanol), keytones (cyclopentatone) and mixtures thereof. Suitable solvents for electroluminescent materials have been described in, for example, published PCT application WO 2007/145979.

In some embodiments, the device is fabricated by liquid deposition of the hole injection layer, the hole transport layer and the emissive layer, and by vapor deposition of the electron transport layer, an electron injection layer and the cathode.

It is understood that the efficiency of devices made with the new compositions described herein, can be further improved by optimizing the other layers in the device. For example, more efficient cathodes such as Ca, Ba or LiF can be used. Shaped substrates and novel hole transport materials that result in a reduction in operating voltage or increase quantum efficiency are also applicable.

Although methods and materials similar or equivalent to those described herein can be used in the practice or testing of the present invention, suitable methods and materials are described below. In addition, the materials, methods, and examples are illustrative only and not intended to be limiting. All publications, patent applications, patents, and other references mentioned herein are incorporated by reference in their entirety.

EXAMPLES

The concepts described herein will be further described in the following examples, which do not limit the scope of the invention described in the claims.

Materials

HIJ-1 is a hole injection material and is made from an aqueous dispersion of an electrically conductive polymer and a polymeric fluorinated sulfonic acid. Such materials have been described in, for example, published U.S. patent applications US 2004/0102577, US 2004/0127637, and US 2005/0205860 and published PCT application WO 2009/018009.

HTM-1 is a triarylamine polymer. Such materials have been described in, for example, published PCT application WO 2009/067419.

Host 1 is a deuterated N-aryl-indolocarbazole. Such materials have been described in, for example, published US patent application US 2011/0101312.

Host 2 is shown below. Such materials have been described in, for example, copending application [UC1006].

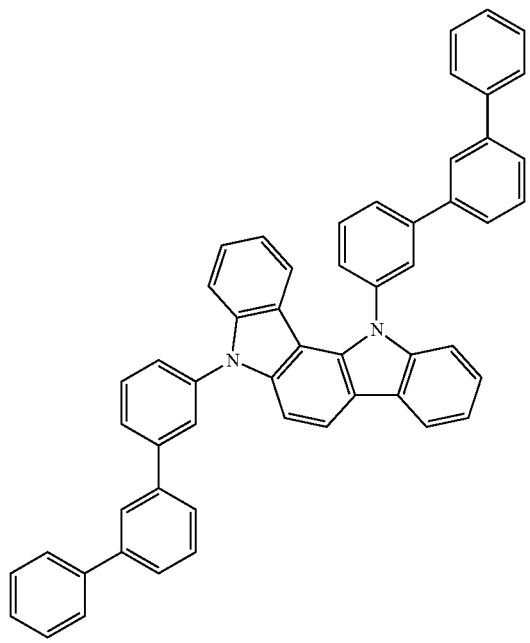 [SMILES: c1ccc(-c2cccc(-c3cccc(-n4c5ccccc5c5c4ccc4c6ccccc6n(-c6cccc(-c7cccc(-c8ccccc8)c7)c6)c45)c3)c2)cc1]

The dopants R11, G11, and B11, as shown above, have red, green, and blue emission, respectively. They are prepared using procedures analogous to those shown in, for example, U.S. Pat. No. 6,670,645 and published US patent application 2010-0148663.

ETM-1 is tris(8-hydroxyquinolinato)aluminum, known as "AlQ".

ETM-1 is 2,4,7,9-tetraphenyl-1,10-phenanthroline

ETM-3 is the compound shown below.

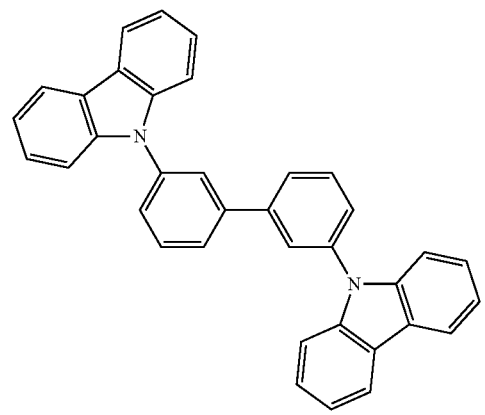 [SMILES: c1cc(-c2cccc(-n3c4ccccc4c4ccccc43)c2)cc(-n2c3ccccc3c3ccccc32)c1]

Comparative Examples A and B

These examples illustrate the performance of white light devices having the architecture shown in FIG. 4.

Comparative Example A had the following device layers, in the order listed, where all percentages are by weight, based on the total weight of the layer.

substrate=glass
anode=indium tin oxide ("ITO") (120 nm)
hole injection layer=HIJ-1 (50 nm)
hole transport layer=HTM-1 (20 nm)
first emissive layer=(32 nm):

0.6% R11
15% G11
67% Host 1
17% Host 2
second emissive layer=(32.4 nm)
8.0% B11
92% ETM-3
electron transport layer=ETM-1 (10 nm)
electron injection layer=CsF (1 nm, as deposited)
cathode=Al (100 nm)

Comparative Example B had the same structure, except that ETM-2 was used in the electron transport layer.

The devices were prepared by depositing the layers on the glass substrate. The hole injection layer was deposited by spin coating from an aqueous dispersion. The hole transport layer and the green and red mixed emissive layer were deposited by spin coating from organic solvent solutions. All other layers were applied by evaporative deposition.

The devices were characterized by measuring their (1) current-voltage (I-V) curves, (2) electroluminescence radiance versus voltage, and (3) electroluminescence spectra versus voltage. All three measurements were performed at the same time and controlled by a computer. The current efficiency (cd/A) of the device at a certain voltage is determined by dividing the electroluminescence radiance of the LED by the current density needed to run the device. The power efficacy (Lm/W) is the current efficiency divided by the operating voltage. The correlated color temperature ("CCT") was calculated from the electroluminance spectra.

The results are given in Table 1.

Comparative Example C

This example illustrates the performance of a white light device having a blue dopant uniformly distributed throughout the electron transport layer.

Comparative Example C has the following device layers, in the order listed, where all percentages are by weight based on the total weight of the layer.
substrate=glass
anode=indium tin oxide ("ITO") (120 nm)
hole injection layer=HIJ-1 (50 nm)
hole transport layer=HTL-1 (20 nm)
emissive layer=(32 nm):
0.6% R11
15% G11
67% Host 1
17% Host 2
electron transport layer=(32.4 nm)
8.0% B11
92% ETM-3
electron injection layer=CsF (1 nm, as deposited)
cathode=Al (100 nm)

The device was prepared by depositing the layers on the glass substrate. The hole injection layer was deposited by spin coating from an aqueous dispersion. The hole transport layer and the mixed red and green emissive layer were deposited by spin coating from organic solvent solutions. The electron transport layer, the electron injection layer and the cathode were applied by evaporative deposition.

The device was characterized as described above for the comparative examples. The results are given in Table 1.

Example 1

This example illustrates the performance of a white light device according to one embodiment of the present invention, as shown in FIG. 6.

Example 1 has the following device layers, in the order listed, where all percentages are by weight based on the total weight of the layer.
substrate=glass
anode=indium tin oxide ("ITO") (120 nm)
hole injection layer=HIJ-1 (50 nm)
hole transport layer=HTL-1 (20 nm)
emissive layer=(32 nm):
0.6% R11
15% G11
67% Host 1
17% Host 2
electron transport layer=42 nm total, with 10 nm of undoped
ETM-3 near the electron injection layer
8.0% B11
92% ETM-3
electron injection layer=CsF (1 nm, as deposited)
cathode=Al (100 nm)

The device was prepared by depositing the layers on the glass substrate. The hole injection layer was deposited by spin coating from an aqueous dispersion. The hole transport layer and the mixed red and green emissive layer were deposited by spin coating from organic solvent solutions. The electron transport layer was applied by evaporative deposition of ETM-3 and B11, turning off the input of B11 after 32 nm of the deposition to form a 10 nm region of undoped ETM-3. The electron injection layer and the cathode were applied by evaporative deposition.

The device was characterized as described above for the comparative examples. The results are given in Table 1.

TABLE. 1

Device Results

| | EQE % | PE lm/W | voltage | CIEx, y | CCT, degree K | T70 |
|---|---|---|---|---|---|---|
| Comp. Ex. A | 11.2% | 6.2 | 10.5 | (0.449, 0.398) | 2894 | 1160 |
| Comp. Ex. B | 12.8% | 11 | 7.8 | (0.443, 0.421) | 3366 | 1300 |
| Comp. Ex. C | 16% | 14.4 | 7.6 | (0.493, 0.421) | 2510 | 1800 |
| Example 1 | 14.3% | 16.9 | 6.4 | (0.454, 0.462) | 3324 | 1800 |

All data at 1000 nits. EQE = external quantum efficiency;
PE = power efficacy;
CIEx, y = x and y color coordinates according to the C.I.E. chromaticity scale (Commission Internationale de L'Eclairage, 1931);
T70 is the time in hours for the luminance to reach 70% of its initial value Comparative Examples A and B are comparative examples, using two of the most common electron transport materials: AlQ and phenanthroline, respectively, as a separate electron transport layer in combination with two emissive layers. In Comparative Example C, one layer was eliminated by combining the blue emissive layer and the electron transport layer into one luminescent electron transport layer. The blue dopant was uniformly distributed in the electron transport layer.

In Example 1, the blue emissive layer and the electron transport layer are combined, but the blue dopant has a concentration gradient in the electron transport layer, such that there is an undoped region adjacent the electron injection layer. This results in higher efficiency and longer lifetime relative to Comparative Examples A and B. The power efficacy is further improved relative to Comparative Example C. Example 1 also has a cooler white temperature relative to Comparative Example C. Cooler white temperature means more contribution from the blue component which has the shortest lifetime among the three emitters. Thus, even though both show the same T70 of 1800 hours, the lifetime of the device in Example 1 would be longer than the device of Comparative Example C at the same color temperature.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed is:

1. An organic electronic device comprising in order: an anode, a hole transport layer, an emissive layer, an electron transport layer, and a cathode, wherein the emissive layer comprises at least one first electroluminescent material, the electron transport layer is a vapor-deposited layer comprising at least one electron transport material and at least one second electroluminescent material such that the second electroluminescent material has a concentration that is greater adjacent, and in direct contact with, the emissive layer, and wherein the device has white light emission.

2. The device of claim 1, wherein the emissive layer further comprises a host material.

3. The device of claim 1, wherein the emissive layer further comprises a third electroluminescent material.

4. The device of claim 3, wherein the first electroluminescent material is a red electroluminescent material, the second electroluminescent material is a blue electroluminescent material, and the third electroluminescent material is a green electroluminescent material.

5. The device of claim 1 consisting essentially of, in order, an anode, a hole injection layer, a hole transport layer, an emissive layer, an electron transport layer, an electron injection layer, and a cathode.

6. The device of claim 1, wherein the electron transport layer has a thickness in the range of 10-200 nm.

7. The device of claim 1, wherein the electron transport layer has a region of undoped electron transport material adjacent the electron injection layer.

8. The device of claim 7, wherein the region of undoped electron transport material has a thickness in the range of 5-15 nm.

9. The device of claim 3, wherein the first and third electroluminescent materials are iridium complexes having organic ligands.

10. The device of claim 1, wherein the second electroluminescent material is an iridium complex having organic ligands.

11. The device of claim 1, wherein the second electroluminescent material is present in an amount of 1% to 49% by weight, based on the total weight of the electron transport layer.

12. The device of claim 1, wherein the electron transport material is a carbazole-containing material.

13. The device of claim 1, wherein the photoluminescence quantum yield of the electron transport layer is greater than 20%.

14. The device of claim 13, wherein the photoluminescence quantum yield of the electron transport layer is greater than 50%.

15. The device of claim 1, wherein the solution photoluminescence quantum yield of the at least one second electroluminescent material is greater than 20%.

16. The device of claim 15, wherein the solution photoluminescence quantum yield is greater than 50%.

* * * * *